US012044639B2

United States Patent
Chalupczak et al.

(10) Patent No.: US 12,044,639 B2
(45) Date of Patent: Jul. 23, 2024

(54) ATOMIC MAGNETOMETER SYSTEM

(71) Applicants: NPL Management Limited, Middlesex (GB); The University of Strathclyde, Scotland (GB)

(72) Inventors: Witold Chalupczak, Bracknell (GB); Rafal Gartman, London (GB); Patrick Bevington, London (GB)

(73) Assignees: NPL Management Limited (GB); The University of Strathclyde (GB)

( * ) Notice: Subject to any disclaimer, the term of this patent is extended or adjusted under 35 U.S.C. 154(b) by 89 days.

(21) Appl. No.: 17/627,401

(22) PCT Filed: Jul. 17, 2020

(86) PCT No.: PCT/GB2020/051719
§ 371 (c)(1),
(2) Date: Jan. 14, 2022

(87) PCT Pub. No.: WO2021/009517
PCT Pub. Date: Jan. 21, 2021

(65) Prior Publication Data
US 2022/0260510 A1 Aug. 18, 2022

(30) Foreign Application Priority Data
Jul. 17, 2019 (GB) .................................. 1910213

(51) Int. Cl.
*G01V 3/00* (2006.01)
*G01N 24/00* (2006.01)
*G01R 33/26* (2006.01)

(52) U.S. Cl.
CPC ........... *G01N 24/006* (2013.01); *G01R 33/26* (2013.01)

(58) Field of Classification Search
CPC ............................. G01N 24/006; G01R 33/26
(Continued)

(56) References Cited

U.S. PATENT DOCUMENTS 3,166,707 A * 1/1965 Bonnet et al. ............ H03L 7/26
324/301
3,246,221 A * 4/1966 Rabier ............... G01R 33/0206
318/647
(Continued)

FOREIGN PATENT DOCUMENTS

CN 106597338 A * 4/2017 ............. G01N 24/10
JP 55151275 11/1980
(Continued)

OTHER PUBLICATIONS

W. Chalupczak et al.; Spin-Exchange Narrowing of the Atomic Ground-State Resonances; Physical Review A; vol. 90; 2014.
(Continued)

*Primary Examiner* — Walter L Lindsay, Jr.
*Assistant Examiner* — Frederick Wenderoth
(74) *Attorney, Agent, or Firm* — Heisler & Associates

(57) ABSTRACT

An atomic magnetometer system is disclosed that includes a variable magnetic field source (14) configured to provide an oscillating primary magnetic field to cause a sample (16) to produce a secondary magnetic field. The atomic magnetometer system also includes an atomic magnetometer for detecting the secondary magnetic field. The atomic magnetometer includes an atomic specimen, a pump and probe subsystem configured to pump the atomic specimen to create a polarisation and to probe atomic coherence precession within the atomic specimen with a probe beam, a detector configured to detect the probe beam to produce a detection signal. The system is configured to drive the variable magnetic field source (14) in dependence on the detection signal with a frequency tuned to rf resonance. A method of operating an atomic magnetometer is also disclosed.

21 Claims, 5 Drawing Sheets

(58) Field of Classification Search
USPC .......................................................... 324/301
See application file for complete search history.

(56) References Cited

U.S. PATENT DOCUMENTS

| | | | | |
|---|---|---|---|---|
| 4,209,746 | A | | 6/1980 | Abramov |
| 5,225,999 | A | * | 7/1993 | Luzzi ................... G01R 33/025 |
| | | | | 361/146 |
| 5,762,072 | A | * | 6/1998 | Conlan ................ A61B 5/1118 |
| | | | | 600/595 |
| 2010/0327869 | A1 | * | 12/2010 | Kim ........................ G01N 27/76 |
| | | | | 324/309 |
| 2013/0341191 | A1 | * | 12/2013 | Smith ..................... G01N 35/00 |
| | | | | 204/601 |
| 2014/0354275 | A1 | * | 12/2014 | Sheng ..................... G01R 33/26 |
| | | | | 324/244.1 |
| 2016/0097875 | A1 | * | 4/2016 | Kowalczyk ............ G01V 3/165 |
| | | | | 701/21 |

FOREIGN PATENT DOCUMENTS

| | | |
|---|---|---|
| JP | 2015121409 | 7/2015 |
| WO | WO2009/073256 | 6/2009 |
| WO | WO2020/016557 | 1/2020 |

OTHER PUBLICATIONS

P. D. D. Schwindt et al.; Self-Oscillating Rubidium Magnetometer Using Nonlinear Magneto-Optical Rotation; Review of Scientific Instruments; vol. 76; 2005.

J. M. Higbie et al.; Robust, High-Speed, All-Optical Atomic Magnetometer; Review of Scientific Instruments; vol. 77; 2006.

J. Belfi et al.; Dual Channel Self-Oscillating Optical Magnetometer; Journal of the Optical Society of America B; vol. 26; 2009.

W. Chaluupczak et al.; Alkali-Metal Spin Maser; Physical Review Letters; vol. 115; 2015.

Y. Takahashi et al.; Quantum Nondemolition Measurement of Spin Via the Paramagnetic Faraday Rotation; Physical Review A; vol. 60; 1999.

M. Savukov et al.; Tunable Atomic Magnetometer for Detection of Radio-Frequency Magnetic Fields; Physical Review Letters; vol. 95; 2005.

D. Kleppner et al.; Theory of the Hydrogen Maser; Physical Review; vol. 126; 1962.

P. Bevington et al.; Imaging of Material Defects with a Radio-Frequency Atomic Magnetometer; Review of Scientific Instruments; vol. 90; 2019.

A. Yoshimi et al.; Nuclear Spin Maser Oscillation of 129Xe by Means of Optical-Detection Feedback; Hyperfine Interactions; vol. 159; 2004.

T. Dogaru et al.; Edge Crack Detection Using a Giant Magnetoresistance Based Eddy Current Sensor; NonDestructive Testing and Evaluation; vol. 16; 2000.

T. Dogaru et al.; Giant Magnetoresistance-Based Eddy-Current Sensor; IEEE Transactions on Magnetics; vol. 37; 2001.

H. J. Krause et al.; Recent Developments in SQUID NDE; Physica C; No. 368; 2002.

J. Storm et al.; An Ultra-Sensitive and Wideband Magnetometer Based on a Superconducting Quantum Interference Device; Applied Physics Letters; No. 110; 2017.

J. Belfi et al.; Stray Magnetic Field Compensation with a Scalar Atomic Magnetometer; Review of Scientific Instruments; No. 81; 2010.

G. Bevilacqua et al.; Multichannel Optical Atomic Magnetometer Operating in Unshielded Environment; Applied Physics B; No. 122; 2016.

M. G. Richards et al.; The 3He Nuclear Zeeman Maser; Journal of Physics B: Atomic, Molecular and Optical Physics; vol. 21; 1988.

T. E. Chupp et al.; Spin-Exchanged-Pumped 3He and 129Xe Zeeman Masers; Physical Review Letters; vol. 72; 1994.

R. E. Stoner et al.; Demonstration of a Two Species Noble Gas Maser; Physical Review Letters; vol. 77; 1996.

D. Bear; Improved Frequency Stability of the Dual-Noble-Gas Maser; Physical Review A; vol. 57; 1998.

T. G. Walker et al.; Spin-Exchange Optical Pumping of Noble-Gas Nuclei; Reviews of Modern Physics; vol. 69; 1997.

H. G. Dehmelt;Modulation of a Light Beam by Precessing Absorbing Atoms; Physical Review; vol. 105; 1957.

A. L. Bloom; Principles of Operation of the Rubidium Vapor Magnetometer; Applied Optics; vol. 1; 1962.

E. S. Ensberg; Experimental Upper Limit for the Permanent Electric Dipole Moment of Rb85 by Optical-Pumping Techniques; Physical Review; vol. 153; 1967.

A. Yoshimi et al.; Nuclear Spin Maser with an Artificial Feedback Mechanism; Physics Letters A; vol. 304; 2002.

A. Yoshimi et al.; Low-Frequency 129Xe Nuclear Spin Oscillator with Optical Spin Detection; Physics Letters A; vol. 376; 2012.

M. J. Usher et al.; A Self-Oscillating Rubidium Vapour Magnetometer for Geomagnetic Measurements; Journal of Scientific Instruments; vol. 41; 1964.

P. Miao et al.; Wide-Range and Self-Locking Atomic Magnetometer Based on Free Spin Precession; Journal of the Optical Society of America B; vol. 36; 2019.

W. Chalupczak et al.; Enhancement of Optically Pumped Spin Orientation Via Spin-Exchange Collisions at Low Vapor Density; Physical Review A; vol. 85; 2012.

W. Chalupczak et al.; Room Temperature Femtotesla Radio-Frequency Atomic Magnetometer; Applied Physics Letters; vol. 100; 2012.

C. Deans et al.; Electromagnetic Induction Imaging with a Radio-Frequency Atomic Magnetometer; Applied Physics Letters; vol. 108; 2016.

A. Wickenbrock et al.; Eddy Current Imaging with an Atomic Radio-Frequency Magnetometer; Applied Physics Letters; vol. 108; 2016.

C. Deans et al.; Through-Barrier Electromagnetic Imaging with an Atomic Magnetometer; Optics Express; vol. 25; 2017.

C. Deans et al.; Sub-Picotesla Widely Tunable Atomic Magnetometer Operating at Room-Temperature in Unshielded Environments; Review of Scientific Instruments; No. 89; 2018.

C. Deans et al.; Active Underwater Detection with an Array of Atomic Magnetometers; Applied Optics; vol. 57; 2018.

P. Bevington et al.; Non-Destructive Structural Imaging of Steelwork with Atomic Magnetometers; Applied Physics Letters; No. 113; 2018.

P. Bevington et al.; Imaging of Material Defects with a Radio-Frequency Atomic Magnetometer; Review of Scientific Instruments; No. 90; 2019.

P. Bevington et al.; Enhanced Material Defect Imaging with a Radio-Frequency Atomic Magnetometer; Journal of Applied Physics; No. 125; 2019.

I. M. Savukov et al.; Detection of NMR Signals with a Radio-Frequency Atomic Magnetometer; Journal of Magnetic Resonance; vol. 185; 2007.

P. Ripka et al.; Advances in Magnetic Field Sensors; IEEE Sensors Journal; vol. 10; 2010.

P. Bevington et al.; Alkali-Metal Spin Maser for Non-Destructive Tests; Applied Physics Letters; vol. 115; 2019.

A. Wickenbrock et al.; Magnetic Induction Tomography Using an All-Optical 87Rb Atomic Magnetometer; Optics Letters; vol. 39; 2014.

W. Chalupczak et al.; Radio-Frequency Spectroscopy as a Tool for Studying Coherent Spin Dynamics and for Application to Radio-Frequency Magnetometry; Advances in Atomic Molecular and Optical Physics; vol. 67; 2018.

* cited by examiner

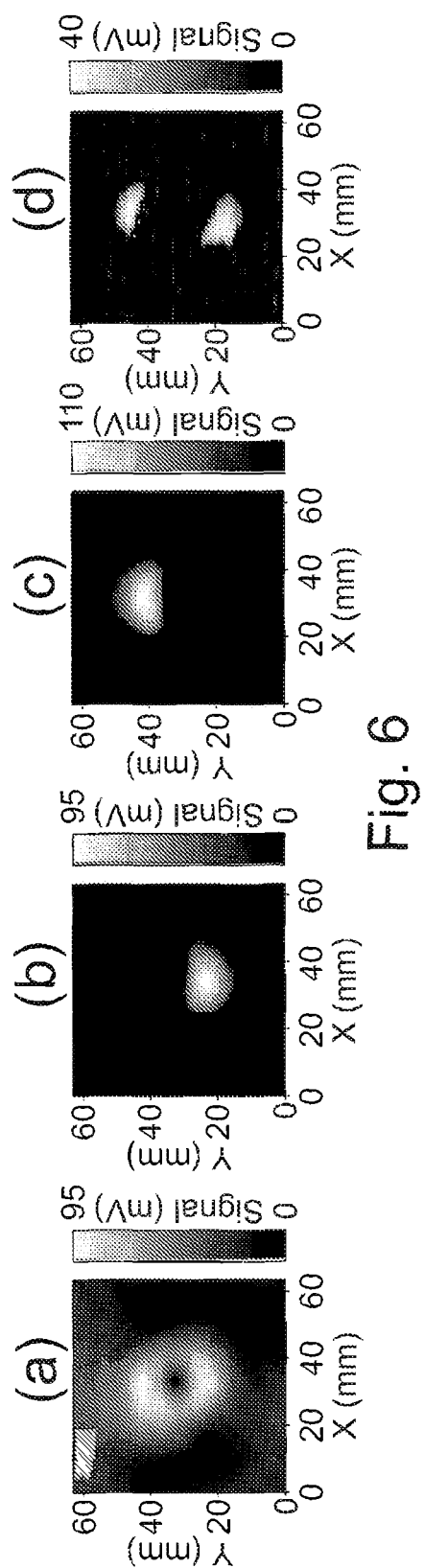
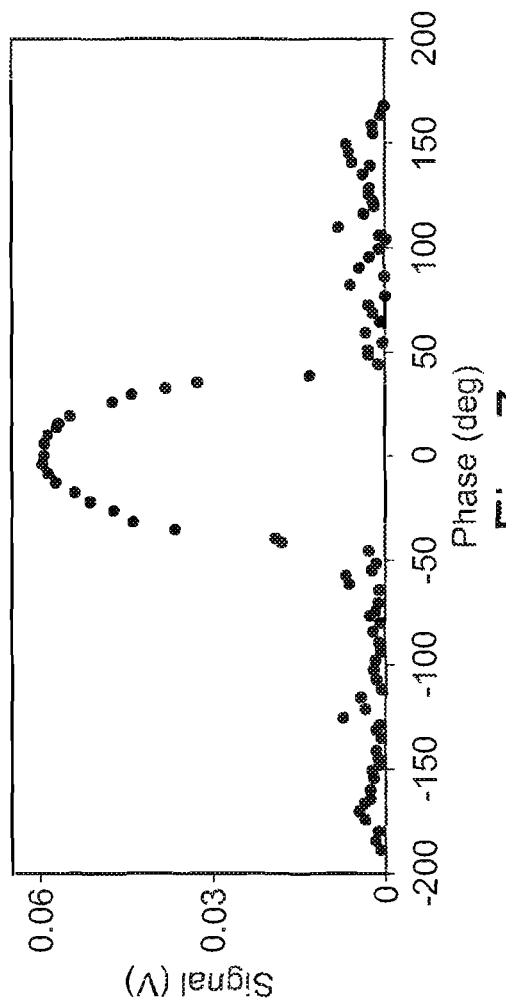
Fig. 6
Fig. 7

ATOMIC MAGNETOMETER SYSTEM

The invention relates to an atomic magnetometer system and method.

Implementation of a radio-frequency (rf) atomic magnetometer as a magnetic field sensor creates new opportunities in non-destructive testing based on magnetic induction tomography (MIT) [1-8] (numbers in square brackets refer to the respective references at the end of this description which are incorporated herein by reference). MIT relies on the detection of a sample's response to an oscillating rf magnetic, so-called primary, field. The material's response, secondary field, is produced by eddy currents in samples that are electrically conductive, and/or by magnetisation in cases that have a magnetic permeability. In addition to a superior sensitivity, wider tuning range [9], and better spatial resolution [10] over standard pick-up coils, atomic magnetometers enable the semi-vector mapping of all components of the secondary field. With respect to other magnetic field sensors, such as giant magnetoresistance (GMR) magnetometers [10-12] or superconducting quantum interference devices (SQUIDs) [13, 14], atomic magnetometers offer the benefit of operation in an unshielded environment [9, 15, 16] without cryogenics and with few restrictions on miniaturisation.

Tomographic imaging of a defect in a sample with an rf atomic magnetometer relies on the observation of the changes in the amplitude and phase of the rf resonance as the sample is moved under the rf primary field coil. Magnetically permeable samples present a challenge to the atomic sensor as the local magnetisation of the sample shifts the rf resonance frequency. The problem is partially addressed by the active stabilisation of the magnetic field in which the sensor operates, however residual changes of the resonance frequency experienced results in a reduced image acquisition rate [7].

Aspects of the present invention seek to provide an improved atomic magnetometer system and method.

According to an aspect of the invention, there is provided an atomic magnetometer system, including:
 a variable magnetic field source configured to provide an oscillating primary magnetic field to cause a sample to produce a secondary magnetic field;
 an atomic magnetometer for detecting the secondary magnetic field; the atomic magnetometer including:
  an atomic specimen;
  a pump and probe subsystem configured to pump the atomic specimen to create a polarisation and to probe atomic coherence precession within the atomic specimen with a probe beam;
  a detector configured to detect the probe beam to produce a detection signal;
 the system being configured to drive the variable magnetic field source in dependence on the detection signal with a frequency tuned to rf resonance.

Embodiments of the invention are able to provide an atomic magnetometer system in which the secondary magnetic field is always tuned to rf resonance. This is able to avoid time-consuming scanning for resonance which is necessary in some prior art systems. It is noted that the primary magnetic field is also tuned to rf resonance in embodiments of the invention. However, it is the secondary magnetic field which the atomic magnetometer is intended to detect.

In embodiments, of the invention, rf resonance is the frequency of the free atomic coherence precession within the atomic specimen.

In embodiments of the invention, atoms of the atomic specimen along with the probe and detection act as an rf generator tuned to rf resonance. By using the signal resulting from the detection of the atomic coherence precession within the atomic specimen to drive the variable magnetic field source, the secondary magnetic field can be automatically kept in resonance.

Prior art systems typically use a separate rf generator to generate an rf signal to drive the variable magnetic field source. The use of the atoms of the atomic specimen, together with the pump and probe subsystem and the detector, as an rf generator, also means that embodiments of the invention can avoid the need for a separate rf generator.

In some embodiments, the system is configured to drive the variable magnetic field source with a frequency corresponding to the oscillation frequency of the detection signal.

In some embodiments, the variable magnetic field source is coupled to an output of the detector so as to be driven in dependence on the detection signal.

In some embodiments, the variable magnetic field source is configured to be placed adjacent to the sample.

In some embodiments, the system includes an instrument processor configured to receive the detection signal and to determine an amplitude and phase thereof. The instrument may be a processor.

In some embodiments, the system includes a voltage follower configured so as to drive the variable magnetic field source with a signal buffered from the detection signal.

The variable magnetic field source, particularly in the case of a low impedance coil, may be coupled to the output of the detector via the voltage follower to drive the variable magnetic field source with a signal buffered from the detection signal.

In some embodiments, the system includes an amplifier configured so as to drive the variable magnetic field source with a signal amplified from the detection signal.

The variable magnetic field source may be coupled to the output of the detector via the amplifier to drive the variable magnetic field source with a signal amplified from the detection signal.

In some embodiments, the system includes a phase shifter configured so as to drive the variable magnetic field source with a signal phase shifted from the detection signal.

The variable magnetic field source may be coupled to the output of the detector via the phase shifter to drive the variable magnetic field source with a signal phase shifted the detection signal.

In some embodiments, the system includes a bias magnetic field source configured to provide to the atomic specimen a bias magnetic field in a bias field direction.

The bias magnetic field may define a quantisation axis for the atomic specimen.

In some embodiments, the variable magnetic field source is an rf coil.

In some embodiments, the variable magnetic field source is driven in dependence on the detection signal with a frequency tuned to rf resonance by having a voltage signal dependent on the detection signal coupled across the rf coil.

The voltage signal coupled across the rf coil may be derived from the detection signal by being an amplification and/or a phase shift thereof but preferably has a frequency corresponding to the frequency of the detection signal.

In some embodiments, the output of the detector is coupled across the rf coil, optionally via voltage follower and/or the amplifier and/or the phase shifter.

In some embodiments, the atomic specimen includes a collection of alkali-metal atoms.

In some embodiments, the atomic specimen includes an alkali-metal atomic vapour.

In some embodiments, the system includes a set of variable magnetic field sources configured to provide the oscillating primary magnetic field, wherein the system is configured to drive each of the variable magnetic field sources in dependence on the detection signal with a frequency tuned to rf resonance and phase shifted with respect to each other.

That each of the variable magnetic field sources are driven phase shifted with respect to each other allows for one of the set to be driven in phase with the detection signal without being driven via a phase shifter. Because of the phase shift, different members of the set of variable magnetic field sources can work in different parts of a defect.

In some embodiments, the system includes at least one phase shifter configured so as to drive at least one of the set of variable magnetic field sources with a signal phase shifted from the detection signal.

Where the signals driving the set of variable magnetic field sources are phase shifted from the detection signal, that may be by a common phase shifter or by their own respective phase shifters.

The set of variable magnetic field sources may each be driven with a signal amplified from the detection signal in a similar way as discussed for an individual variable magnetic field source. Where the signals driving the set of variable magnetic field sources are amplified, they may be by a common amplifier or by their own respective amplifiers.

In some embodiments, the atomic magnetometer is configured so as to reduce the effect on the atomic magnetometer of components of the primary and secondary magnetic fields in a primary direction substantially orthogonal to a surface of the sample.

In embodiments, the primary direction is a direction from the variable magnetic field source to the atomic specimen.

In embodiments, the surface of the sample is the surface under investigation, typically a major surface of the sample.

Some embodiments include a compensatory magnetic field source, which may include a coil arrangement, for providing a compensatory magnetic field at the atomic magnetometer, in particular at the atomic specimen thereof, including a component in the primary direction.

The compensatory magnetic field source can be configured to provide the compensatory magnetic field to reduce the effect on the atomic magnetometer of components of the primary and secondary magnetic fields in the primary direction.

In some embodiments, the atomic magnetometer is in the self-compensation configuration.

In some embodiments, the atomic magnetometer has an insensitive axis arranged in the primary direction.

In some embodiments, the atomic magnetometer includes a bias magnetic field source configured to provide a bias magnetic field in the primary direction.

According to an aspect of the invention, there is provided a method of operating an atomic magnetometer to detect a secondary magnetic field produced by a sample, including:
  pumping an atomic specimen to create a polarisation and probing atomic coherence precession within the atomic specimen with a probe beam;
  detecting the probe beam to produce a detection signal;
  driving a variable magnetic field source in dependence on the detection signal to provide an oscillating primary magnetic field to cause the sample to produce the secondary magnetic field with a frequency tuned to rf resonance.

In some embodiments, driving a variable magnetic field source in dependence on the detection signal includes driving the variable magnetic field source with a signal buffered, and/or amplified, and/or phase shifted, from the detection signal.

In some embodiments, driving a variable magnetic field source in dependence on the detection signal includes driving the variable magnetic field source with a frequency corresponding to a frequency of the detection signal.

In some embodiments, the method includes positioning the atomic specimen in a bias magnetic field.

In some embodiments, the method includes determining an amplitude and phase of the detection signal in order to detect the secondary magnetic field.

The method can include reducing the effect on the atomic magnetometer of components of the primary and secondary magnetic fields in a direction substantially orthogonal to a surface of the sample.

In embodiments, the surface of the sample is the surface under investigation, typically a major surface of the sample.

The primary magnetic field may be substantially orthogonal to the surface of the sample.

In some embodiments, reducing the effect on an atomic magnetometer of components of the primary and secondary magnetic fields in a direction substantially orthogonal to a surface of a sample includes:
  providing a compensatory magnetic field at the atomic magnetometer, for example at the atomic specimen, including a component substantially orthogonal to the surface of the sample.

In some embodiments, the compensatory magnetic field is provided such that Bz'+bz=0, wherein Bz' is a component of $\vec{B'}$ which is substantially orthogonal to the surface of the sample, bz is a component of the secondary magnetic field which is substantially orthogonal to the surface of the sample, $\vec{B'}=\vec{B}+\vec{B_C}$, $\vec{B}$ is the primary magnetic field, and $\vec{B_C}$ is the compensatory magnetic field.

In some embodiments, reducing the effect on an atomic magnetometer of components of the primary and secondary magnetic fields in a direction substantially orthogonal to a surface of a sample includes:
  aligning an insensitive axis of the atomic magnetometer with a direction substantially orthogonal to the surface of the sample.

In some embodiments, the method includes aligning a bias magnetic field with a direction substantially orthogonal to the surface of the sample.

Radio-frequency atomic magnetometers offer an attractive alternative to standard detection methods in non-destructive testing that are based on inductive measurements. Embodiments provide a magnetometer in the so-called spin maser configuration, which addresses two important challenges of the technique: shifts in the radio-frequency resonance position caused by magnetically permeable samples and the sensor bandwidth.

Embodiments provide a spin maser for non-destructive testing and detection.

Embodiments of the invention are described below, by way of example only, with reference to the accompanying drawings.

FIG. 6 shows the measured change of the amplitude of the rf spectroscopy signal over a 64×64 mm² area of a 6 mm thick carbon steel plate, containing a 24 mm diameter recess that is 2.4 mm deep, recorded in four measurement configurations: (a) self-compensation configuration as in [8], self-compensation configuration in the spin maser mode with (b) a single rf coil, (c) single rf coil with an opposite phase to (b), and (c) two rf coils with opposite phases.

FIG. 7 shows the dependence of the signal amplitude as a function of the phase of the drive.

Figure 8:
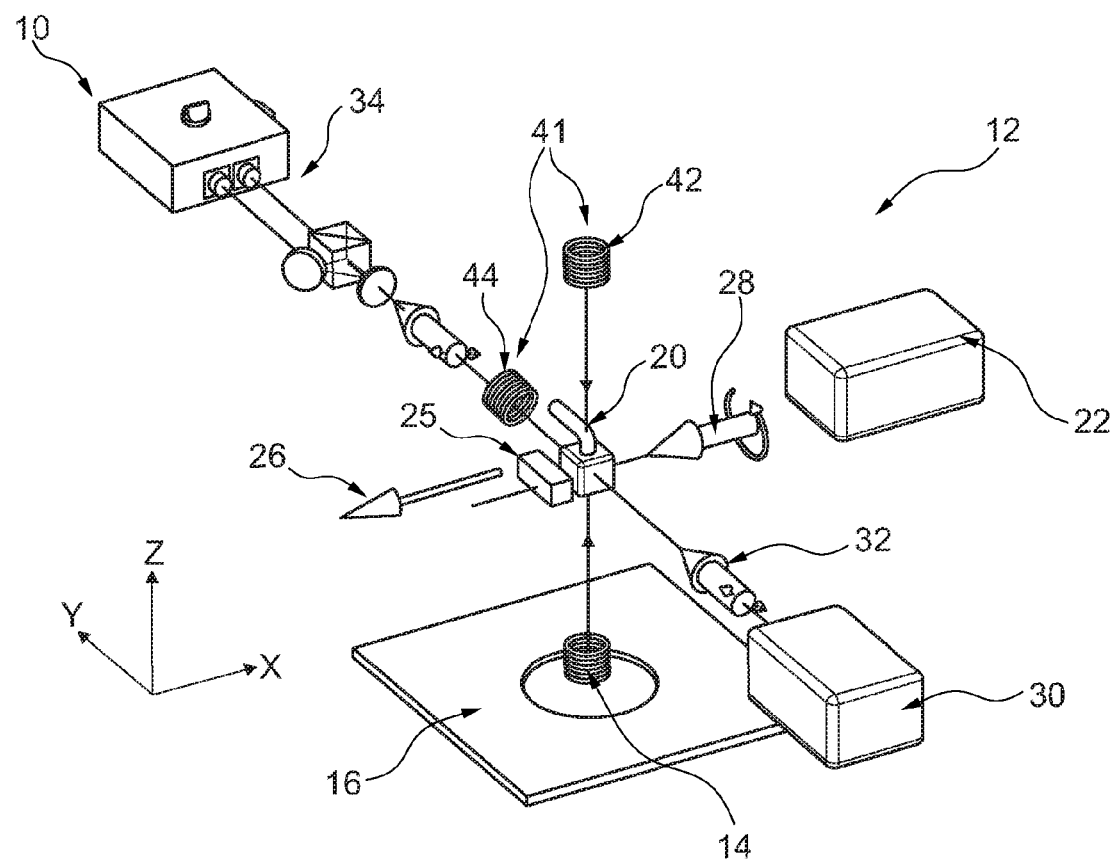

FIG. 8 shows a system according to an embodiment of the invention.

Conventional non-destructive testing and detection of ferromagnetic objects with magnetic inductive tomography with atomic magnetometers suffers from rf resonance shifts induced by the tested objects. Spin maser operation as described herein can solve that problem and enable significant reduction of the image acquisition time.

Embodiments provide a mode of operation of the radio-frequency atomic magnetometer, so-called spin maser. The mode relies on the spontaneous fluctuations of the atomic spin being optically monitored and the signal from the optical detection being fed back to the atomic specimen. Spin maser operation frequency automatically follows current value of the bias field. Feedback loops can include a buffer, amplification and phase shift. Benefits include significant reduction of the image acquisition time, image contrast, and stealth operation in case of surveillance.

Embodiments of the invention can find application for detecting corrosion under insulation for energy sector, monitoring of the re-enforced concrete structures for transport sector, nuclear waste vessels monitoring, object detection, surveillance.

Figure 1:
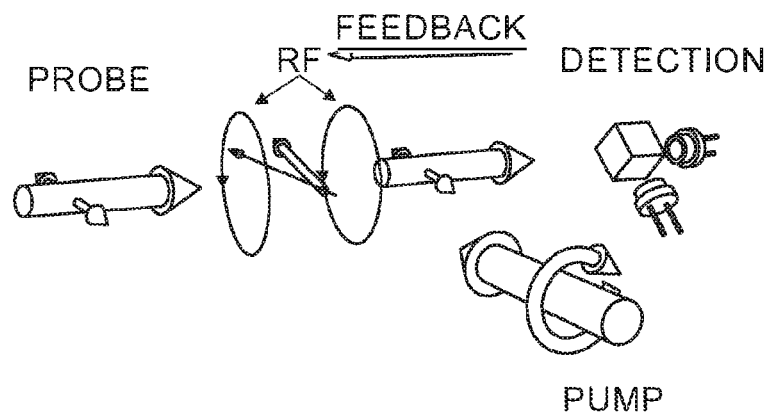
FIG. 1 shows a standard alkali-metal spin maser equivalent to that discussed in [23].

Embodiments provide an implementation of an rf atomic magnetometer operating in the spin maser mode into an MIT measurement scheme. The positive feedback in the spin maser system offers not only a solution to the problem of imperfect magnetic field stabilisation but it also increases the sensor bandwidth, image acquisition rate and signal-to-noise ratio. Extensive theoretical and experimental studies of the spin maser systems, also called Zeeman masers, have been conducted in the context of noble gas systems [17-20]. A typical spin maser system includes two parts: a pumping bulb, where the nuclear spin polarization is generated and a maser bulb surrounded by a pick-up coil, which detects oscillations of the spins in a static magnetic field and provides positive feedback. The spin polarization is achieved either by direct optical pumping e.g. with a discharge lamp [17] or through spin-exchange pumping, i.e. transfer of polarization from directly optically pumped alkali-metal atoms to the noble gas atoms mediated by spin-exchange collisions [21]. Nuclear spins precessing around a static magnetic field induce a current in the coil surrounding the maser bulb and consequently an oscillating magnetic field within the bulb. This magnetic field mirrors the spin evolution and provides positive feedback. In contrast to the nuclear spin maser configuration, an rf atomic magnetometer monitors the spontaneous fluctuations in the polarized spin sample optically [22-24]. This is due to the small strength of the oscillating magnetic field produced by the precessing spins in low-density alkali-metal vapour ($10^{10-13}$ cm$^{-3}$) compared to that created by the spins of noble gases (above ~$10^{18}$ cm$^{-3}$) [25]. The detected signal is fed into an rf coil located in the vicinity of the atomic vapour, FIG. 1. This separation of monitoring and feedback allows for the introduction of amplification and a phase shift into the feedback loop.

Embodiments of the present invention utilise rf atomic magnetometers and can be used for material defects imaging.

A detailed embodiment is described below, which is an implementation of the alkali-metal spin maser described above.

Figure 2:
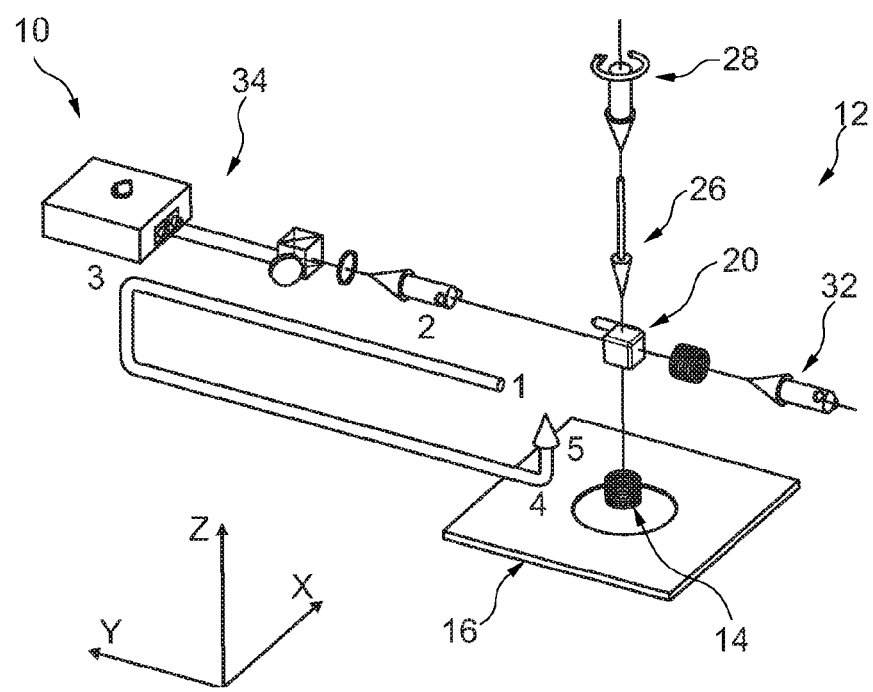
FIG. 2 is a diagram of a system according to an embodiment of the invention.

As can be seen in FIG. 2, an embodiment of the invention includes a system 10 including a radio-frequency atomic magnetometer 12 and a variable primary magnetic field source 14 configured to provide a primary magnetic field oscillating at rf frequency. The system can be referred to as a tomographic magnetic inductive imaging setup and can provide a spin maser in magnetic inductive measurement. In this embodiment, the primary magnetic field source 14 is an rf coil; however, other variable magnetic field sources can be used in other embodiments. The rf coil is configured to provide a primary magnetic field substantially orthogonal to a surface of the sample. In this embodiment, the surface is the surface under investigation, which is a major surface of the sample.

In this embodiment, the system is configured to run in an unshielded environment with the same instrumentation described in [6-8], which are incorporated herein by reference.

In this embodiment, the rf coil 14 is a 1000 turn coil with 0.02 mm diameter copper wire, height 10 mm, 2 mm and 4 mm inner and outer diameters.

The rf coil 14 is configured so that it can be placed adjacent to a sample 16, but entirely on one side thereof and in a non-overlapping relationship therewith, and can be operated to generate an oscillating primary magnetic field to cause the sample to produce a secondary magnetic field. The secondary magnetic field is indicative of a material response of the sample.

Samples should be electrically conductive (although not necessarily highly electrically conductive) and/or should have a magnetic permeability such that they can be magnetised.

The atomic magnetometer is configured to detect the secondary magnetic field.

It is worth noting that ferromagnetic targets produce 2 types of secondary fields:
- a secondary magnetic field in the same direction as the applied primary field—*the secondary magnetisation*, and
- eddy current induced magnetic field in the opposite direction to the applied primary field—*the eddy current induced magnetic field*.

In this description, the z direction is the direction orthogonal to the surface of the sample, and the x and y directions are mutually orthogonal directions that are parallel to the surface of the sample.

In this embodiment, the atomic magnetometer 12 includes a detection cell 20, which in this embodiment is a 1 cm³ paraffin coated glass cell at ambient temperature containing caesium atomic vapour (for which atomic density $n_{Cs}$=3.3× $10^{10}$ cm$^{-3}$). The caesium atomic vapour provides an atomic specimen for the magnetometer.

The magnetometer includes a bias magnetic field source 24 (not shown in FIG. 2) configured to provide a bias magnetic field 26 at the detection cell 20 and therefore to the atomic specimen in a bias magnetic field direction. The terms 'bias' and 'offset' are used interchangeably in the context of this magnetic field.

In this embodiment, the offset magnetic field is actively stabilised by three pairs of nested, orthogonal, square Helmholtz coils [3, 6-8, 35]. These provide the bias magnetic field source.

The magnetometer includes a pump laser (not shown in FIG. 2) configured to pump the atoms of the atomic specimen in the detection cell 20 with a circularly polarised pump laser beam 28 propagating along the direction of the offset field. In this embodiment, the pump laser is a diode laser frequency stabilised to the $6\ ^2S_{1/2}\ F=3 \rightarrow 6\ ^2P_{3/2}\ F'=2$ transition (D2 line, 852 nm).

The pump laser beam 28 is configured to pump the atomic specimen to create a polarisation or a population imbalance or anisotropy along the bias magnetic field.

The atomic magnetometer includes a probe laser (not shown in FIG. 2) configured to probe the detection cell 20 to probe atomic coherence precession within the atomic specimen with a linearly polarised probe laser beam 32 orthogonal to the bias magnetic field 26 and phase-offset-locked to the pump beam, in this embodiment bringing it 800 MHz blue shifted from the $6\ ^2S_{1/2}\ F=4 \rightarrow 6\ ^2P_{3/2}\ F'=5$ transition.

The pump laser and probe laser form a pump and probe subsystem.

The evolution of the collective atomic spin is mapped onto the polarisation state of the linearly polarised probe beam.

In this embodiment, the atomic magnetometer 12 is configured so as to reduce the effect on the atomic magnetometer 12 of components of the primary magnetic field and optionally also the secondary magnetic field in the direction substantially orthogonal to the surface of the sample, referred to as a primary direction or z. In this embodiment, the primary direction is a direction, along the rf coil axis, from the rf coil to the atomic specimen. In this embodiment, this is by the atomic magnetometer being in the self-compensation configuration, wherein the atomic magnetometer has an insensitive axis arranged in the primary direction, wherein the axis of the rf coil and therefore the axis of the primary field are in the primary direction and parallel to the bias field direction. The bias field direction is therefore also in the primary direction in this embodiment. For the bias magnetic field ($\vec{B}_{bias}$) oriented along z, which is preferably also the primary magnetic field ($\vec{B}$) direction, $B_z$ (which is the component of $\vec{B}$ along z) will be absent in the rf atomic magnetometer signal. Details of this are described in [8] and in PCT/GB2019/051953, published as WO2020/016557, which are incorporated herein by reference.

It is possible to use other ways of reducing the effect on the atomic magnetometer of components of the primary and optionally secondary magnetic fields in the direction substantially orthogonal to the surface of the sample as disclosed in [8] and in WO2020/016557. For example, some embodiments include a compensatory magnetic field source, which may include a coil arrangement, for providing a compensatory magnetic field at the atomic magnetometer, in particular at the atomic specimen thereof, including a component in the primary direction. In such embodiments, the compensatory magnetic field may be provided such that $B_z'+b_z=0$, wherein $B_z'$ is a component of $\vec{B'}$ which is along z and substantially orthogonal to the surface of the sample, $b_z$ is a component of the secondary magnetic field which is along z and substantially orthogonal to the surface of the sample, $\vec{B'}=\vec{B}+\vec{B}_C$, $\vec{B}$ is the primary magnetic field, and $\vec{B}_C$ is the compensatory magnetic field.

FIG. 8 is an example of a system including a compensatory magnetic field source 41 for providing an oscillating compensatory magnetic field, also called a compensation magnetic field, at the atomic magnetometer, specifically at the detection cell 20, including a component substantially orthogonal to the surface of the sample 16 reducing and preferably eliminating the effect on the atomic magnetometer of magnetic field components of the primary and secondary fields in that direction. In particular, the compensatory magnetic field compensates the primary field contribution to the resultant field monitored by the atomic magnetometer vapour cell, without changing the efficiency of secondary field ($\vec{b}$) excitation.

As can be seen from FIG. 8, in this embodiment the compensatory magnetic field source 41 is a compensation coil arrangement including a first compensation coil 42 and a second compensation coil 44.

The first compensation coil 42 has an axis substantially aligned with z, a direction orthogonal to the surface of the sample 16 so as to provide a magnetic field at the atomic magnetometer, specifically at the detection cell 20, which is substantially orthogonal to the surface of the sample 16.

In this embodiment, the detection cell 20 is located between the rf coil 14 and the first compensation coil 42, although this is not necessary in all embodiments.

The second compensation coil 44 has an axis substantially aligned with y, a direction parallel to the surface of the sample 16 and substantially orthogonal to the bias field direction so as to provide a magnetic field at the atomic magnetometer, specifically at the detection cell 20 which is substantially parallel to the surface of the sample 16 and substantially orthogonal to the bias field direction.

In this embodiment, the detection cell 20 is located between the probe laser 30 and the second compensation coil 44, and the second compensation coil 44 is located between the detection cell 20 and the balanced polarimeter 34, although this is not necessary in all embodiments.

The compensatory coil arrangement 41 is configured to provide, at the detection cell 20, a compensatory magnetic field $\vec{B}_C$.

In other words, a set of two rf coils oriented along z and y directions (FIG. 8) creates an oscillating magnetic field, $\vec{B}_C$, that compensates the primary field seen by the atomic magnetometer. The coils are driven by the detection signal in a similar way disclosed herein to drive the rf coil 14 to generate $\vec{B}$. This keeps a constant phase difference between the fields $\vec{B}$ and $\vec{B}_C$.

In other words, the primary field is compensated in the vapour cell by a set of two rf coils oriented along the z and y direction.

However, for reasons explained below, the component of the secondary magnetic field in the z direction is optionally also compensated.

The amplitudes of the two components of $\vec{B}_C$ can be varied by changing the distance of the relevant coils from the vapour cell.

The resultant magnetic field monitored by the rf atomic magnetometer includes components from the primary, secondary and compensation field, in other words $\vec{b}+\vec{B}+\vec{B}_C=\vec{b}+\vec{B''}$.

The configuration allows determination of amplitude and phase (orientation) of the rf field in the yz plane. The amplitude $(R=\sqrt{(b_y+B'_y)^2+(b_z+B'_z)^2})$ and the phase $$\left(\varphi = \arctan\left(\frac{b_y + B'_y}{b_z + B'_z}\right)\right)$$

of the rf spectroscopy signal describes changes in the resultant field, where $b_z+B'_z$ and $b_y+B'_y$ are the two quadrature components of the rf signal.

As explained in WO2020/016557 and [8], the condition for achieving maximum contrast, with respect to the 2 axis components, is when $B'_z+b_{z,max}=0$.

Although in the embodiment of FIG. 8, $\vec{B_C}$ has components in direction y as well as z, this is not necessary in every embodiment. For example, it is possible to compensate only in the z direction. In the FIG. 8 embodiment, this means that the second compensation coil 44 can be omitted.

It is not necessary in every embodiment to reduce the effect on the atomic magnetometer 12 of components of the primary and secondary magnetic fields in the direction substantially orthogonal to the surface of the sample.

Returning to the embodiment of FIG. 2, the atomic magnetometer includes a detector. In this embodiment, the detector includes a polarimeter 34 configured to receive the probe laser beam after passing through the detection cell 20. The polarimeter 34 includes a crystal polariser oriented at 45° with respect to the incident polarisation and a commercial balanced photodetector.

The laser light transmitted through the cell 20 is analysed by the polarimeter.

The detector is configured to output via an output a detection signal in response to detection of the probe laser beam. This detection signal is typically a voltage or current signal representing the polarisation and/or amplitude of the detected probe beam. The output of the detector is in this embodiment an output of the balanced photodetector providing a voltage signal representing a polarisation of the probe beam.

Figure 3:
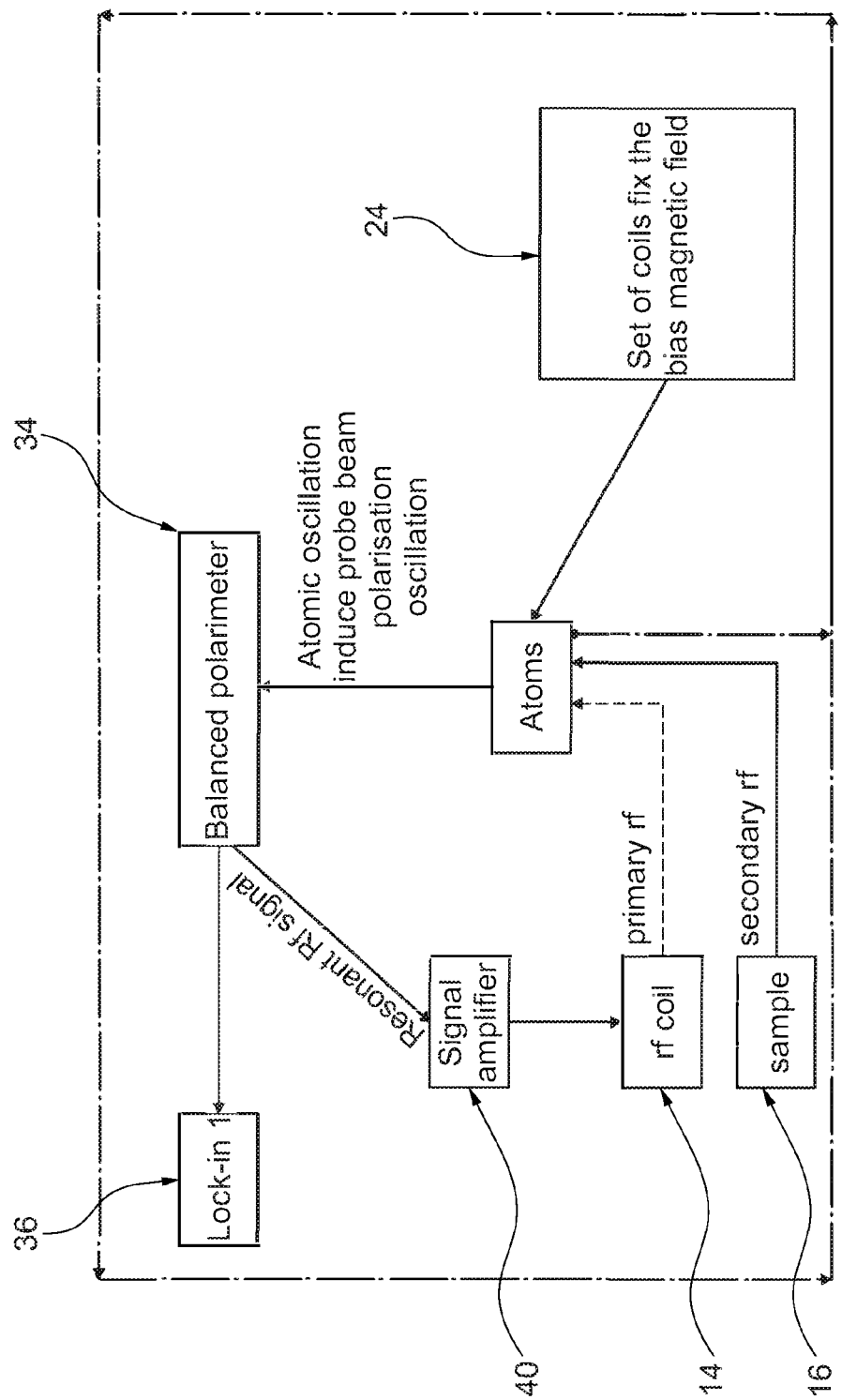
FIG. 3 is a schematic diagram of the system of FIG. 2.
Figure 4:
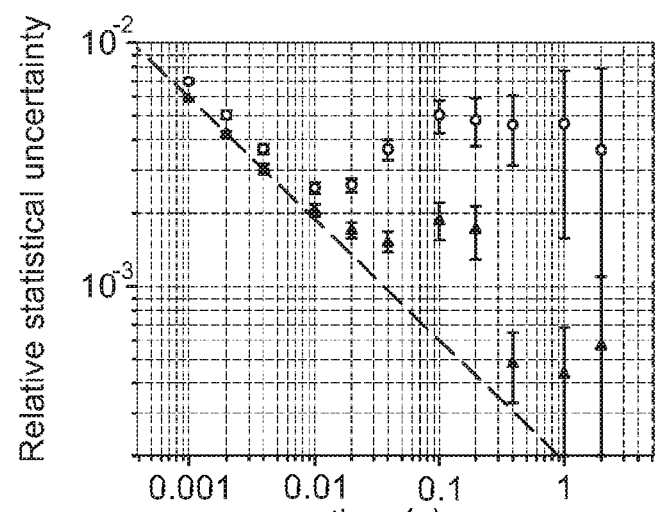
FIG. 4 shows the statistical uncertainty (Allan deviation) of signal amplitude from a magnetometer in the standard configuration (red circles) and in the spin maser mode (black diamonds).

In this embodiment, the system 10 includes a lock-in amplifier 36 (shown in FIG. 3) configured to receive the detection signal from the detector. The lock-in amplifier is configured to record or determine an amplitude and phase of the detection signal, also known as the atomic signal, the lock-in amplifier being referenced to the signal frequency, and to provide a first output signal for example to a computer. The computer can use the amplitude and phase of the signal to detect the secondary magnetic field and thereby a material response of the sample, and in some cases to perform material defects imaging.

In some embodiments, the computer can include a receiver to receive the first output signal from the lock-in amplifier 36 and to determine therefrom changes in conductivity and/or permeability of the sample.

The rf coil 14 is connected, via an amplifier 40 (shown in FIG. 3), to the output of the detector. The amplifier 40 is configured to receive the detection signal from the detector and to amplify it so as to drive the rf coil 14 in dependence on the detection signal with a frequency tuned to rf resonance, rf resonance being the frequency of the free atomic coherence precession within the atomic specimen. In this embodiment, the amplifier is configured to amplify the detection signal and apply that amplified signal as a voltage across the rf coil 14. The frequency tuning to rf resonance is provided automatically as a result of the atomic specimen being the source of the signal and serving, together with the pump and probe subsystem and the detector, as the rf generator.

In some embodiments, the system can include a voltage follower, in addition to or instead of an amplifier, configured so as to drive the variable magnetic field source with a signal buffered from the detection signal. This is particularly advantageous where the rf coil is a low impedance coil.

It is not necessary in all embodiments to have an amplifier or a voltage follower. In some embodiments, the detection signal can be applied directly across the rf coil.

In some embodiments, the system can include a phase shifter configured to shift the phase of the signal driving the primary magnetic field source, and therefore to shift the phase of the primary and secondary magnetic fields, with respect to the detection signal.

FIG. 2 shows the phases of spin maser operation in magnetic induction tomography measurement according to this embodiment. (1) Spontaneous fluctuation of atoms in the atomic specimen creates small atomic spin precessing at Larmor frequency. (2) The probe beam monitors the spin evolution and spin precession is mapped onto the beam polarization. (3) Photodetector creates voltage oscillations following polarization changes. (4) Amplified and possibly phase shifted signal from photodetector generates current in the primary rf field coil. (5) Primary and/or secondary field provide positive feedback to the atomic spin precession.

In operation, the bias magnetic field source 24 provides a bias magnetic field at the detection cell 20.

The pump laser is operated to pump the atomic specimen to create a polarisation or a population imbalance or anisotropy along the bias magnetic field.

The probe laser is operated to probe atomic coherence precession within the atomic specimen with the probe beam.

The probe beam is detected by the detector and the detector outputs a detection signal.

The detection signal is amplified and the amplified signal is applied across the rf coil to drive the rf coil 14 in dependence on the detection signal to provide an oscillating primary magnetic field to cause the sample to produce the secondary magnetic field with a frequency tuned to rf resonance. As mentioned elsewhere, in some embodiments it is possible to omit the amplification and/or to include a phase shift.

Embodiments can be used to provide the following advantages:
- Be safe and non-invasive (e.g. non-ionising radiations)
- Detect corrosion on the inner-wall of a pipeline.
- Detect corrosion on the outer-wall of a pipeline.
- Be able to differentiate between corrosion and changes to pipeline geometries from bends/T-Junctions/welds in the pipe.
- Be able to scan through all insulation types.
- Be low cost.
- Provide improvements to current techniques (resolution, switch scanning-modes).

In some embodiments, the system can include a set of variable magnetic field sources configured to provide the oscillating primary magnetic field, wherein the system is configured to drive each variable magnetic field source in dependence on the detection signal with a frequency tuned to rf resonance and phase shifted with respect to each other and from the detection signal, although it is not excluded that one can be in phase with the detection signal. Each of the variable magnetic field sources effectively provides a component of each of the primary and secondary magnetic fields, and each of those components can operate as described above (where reference above is simply to the primary or secondary magnetic field). The set of variable magnetic field sources can be a set of rf coils, each being configured as described above. At least one of the set of variable magnetic field sources is driven via a phase shifter as described above in order to ensure a relative phase difference between the set of variable magnetic field sources. Where a phase shifter, voltage follower and/or amplifier is to be used for more than one of the set of variable magnetic field sources, a phase shifter, voltage follower and/or amplifier can be common to a plurality, possibly all, of the set of variable magnetic field sources and/or a plurality, possibly all, of the set of variable magnetic field sources can use their own respective phase shifters, voltage followers and/or amplifiers.

The skilled person will appreciate that the particular atomic magnetometer described above is not the only type of atomic magnetometer that can be used; for example, different detection cells, different dimensions, different powers, different laser frequencies, and different transitions can be employed as appropriate. In particular, atoms other than Cs atoms can be used in solid state, liquid, and/or vapour form, and the frequencies and powers can be adjusted accordingly. Furthermore, the means of pumping, field generation and probe beam detection can be varied. For example, the pump and probe subsystem can use one, two, three, or more lasers to perform the pumping and probing, and the polarisations of the beams can be varied in some embodiments. The probe beam detector can also be varied but is preferably a photodetector that can detect the polarisation and/or amplitude of the probe beam.

In some embodiments, it is possible to use the Earth's magnetic field as the bias field and therefore omit the bias magnetic field source.

In some embodiments, processing can be applied to the detection signal before being used to drive the variable magnetic field source. However, in all embodiments, the signal driving the variable magnetic field source and therefore the oscillation of the primary and secondary magnetic fields should be dependent on the detection signal so as to have the same frequency thereof.

Although in the embodiments above, a lock-in amplifier 36 is described as recording or determine the amplitude and phase of the atomic signal, any processor can be used provided it can demodulate the detection signal with reference to the frequency of the signal.

Although in the embodiments above, the material response detection is used for material defects imaging, this is not necessary in every embodiment. In some embodiments, the material response detection can be used for other purposes.

EXAMPLES

Advantageous properties of the self-oscillating sensor are presented in both a magnetically shielded and an open environment. Demonstration of defect detection via magnetic induction tomography in a ferromagnetic carbon steel sample is presented. The configuration discussed, can provide for a simple and robust non-destructive material defect detection system based on an atomic magnetometer.

The measurements described below, are performed in two configurations: an rf atomic magnetometer in a shielded [28-30] and an open environment [6-8]. In the shielded environment, we explore fundamental properties of the spin maser. We compare the atomic response to the rf drive with and without a feedback loop. Implementation of the spin maser in the imaging of defects in a carbon steel plate through MIT with an unshielded rf atomic magnetometer is presented. So far, in the context of magnetometry, spin maser action in an rf system has been mostly explored in the context of geomagnetic measurements [23, 26]. Feedback loops have been also studied in self-oscillating dc atomic magnetometers [31-33]. The sensors were demonstrated to deliver the bandwidth (~5 kHz) exceeding that indicated by the linewidth of the spectral coherence profile. Previous demonstrations of alkali-metal spin masers include also non-linear couplings, i.e. the combination of non-linear spin dynamics driven by a linearly polarized laser beam and indirect optical pumping [34]. The case described here exploits the linear response of the atomic system.

Experimental set up. In a shielded environment, the ambient magnetic field is suppressed by the use of five layers of cylindrical shields with end caps, made from 2-mm thick mu-metal [28-30, 34]. A solenoid inside the shield generates a well-controlled offset magnetic field. In the open configuration, the measurements are performed in a magnetically unshielded environment, where the offset magnetic field is actively stabilised by three pairs of nested, orthogonal, square Helmholtz coils [3, 6-8, 35]. In both setups, caesium atomic vapour is housed in a paraffin-coated cell at ambient temperature (atomic density $n_{Cs}$=0.33 $10^{11}$ cm$^{-3}$). Atoms are optically pumped by a circularly polarised laser beam propagating along the direction of the offset field, FIG. 1. The beam is provided by a diode laser, frequency stabilized to the $6\ ^2S_{1/2}$ F=3→$6\ ^2P_{3/2}$ F'=2 transition (D2 line, 852 nm. The evolution of the collective atomic spin is mapped onto the polarization state of the linearly polarized probe beam [29, 36, 37]. The probe beam is phase-offset-locked to the pump beam, bringing it 800 MHz blue shifted from the $6\ ^2S_{1/2}$ F=4→$6,^2P_{3/2}$ F'=5 transition. The laser light transmitted through the cell is analysed by a polarimeter consisting of a crystal polariser oriented at 45° with respect to the incident polarization and a commercial balanced photodetector. The resulting signal is measured by either a lock-in amplifier referenced to the driving rf field frequency or a 2 MS/s data acquisition board.

Figure 5:
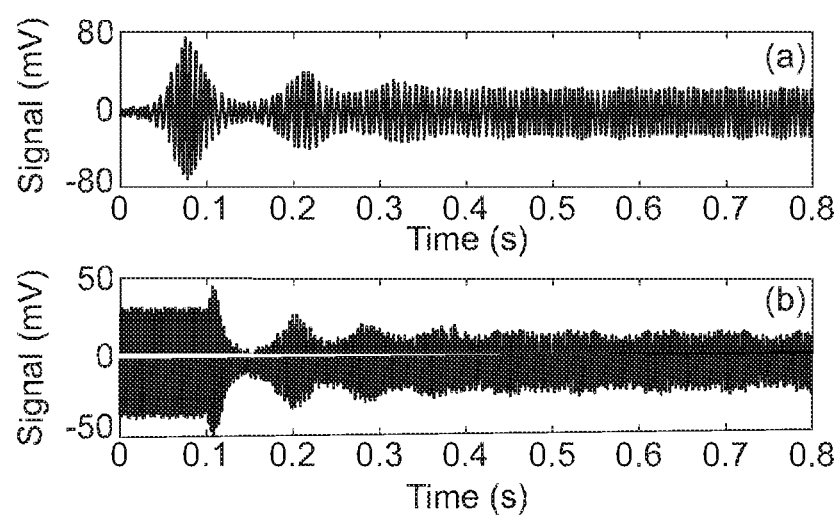
FIG. 5 shows transient in self-oscillating magnetometer signal.

Shielded setup. Operation of the rf magnetometer in the standard mode and in the spin maser configuration is compared through the Allan deviation of the signal amplitude. Our goal is to illustrate the advantage of the spin maser system autonomous tuning to the rf resonance. To simulate the effect of a noisy environment, the stability of the current source (Keithley 6220) that drives the offset field coils and defines the rf resonance frequency was reduced. FIG. 5 shows the time dependence of the statistical uncertainty of the amplitude of the rf magnetometer in the standard configuration (red circles), where rf field is produced by tunable waveform generator and in the spin maser mode (black diamonds). For the former, drifts in the offset magnetic field results in a departure from a ~√τ dependence (dashed blue line) for an integration time above 10 ms. Dependence of the amplitude statistical uncertainty on the integration time (~√τ, marked with a dashed blue line) indicates a dominant 'white noise' character. Stability of the spin maser oscillation amplitude is limited by the fluctuations in the probe beam power that is delivered to the system through a single mode polarization maintaining fibre.

One of the characteristic properties of the spin maser is the start-up' oscillation, i.e. the transient periodic variation in the maser oscillation amplitude at the beginning of the maser operation [19]. The amplitude variation is equivalent to those observed in any system, with a high gain feedback loop, that approaches a stationary state after a sudden change in operating conditions. Two scenarios in the alkali-metal spin masers where transient dynamics could be observed are shown in FIG. 6: (a) at the immediate beginning of the spin maser operation in the offset field of 5.7 μT and (b) in the case of a significant frequency jump. The latter case is caused by the variation of the coil Q factor with operational frequency. In particular, FIG. 6 shows transient behaviour in the self-oscillating magnetometer signal observed when the magnetic field is changed, in terms of Larmor frequency, from 5 kHz to 40 kHz. The measurement was performed with the pump/probe beam power of 500 mW/150 mW. Transient amplitude oscillations are not observed if the frequency change is smaller than 1 kHz, which is the biggest shift recorded in these experiments with ferromagnetic objects.

Spin maser in magnetic inductive measurement. The alkali-metal spin maser described above has been implemented into a tomographic magnetic inductive imaging setup. The measurement is run in an unshielded environment with the same instrumentation already described in [6-8]. The rf coil generating the primary field (1000 turns of 0.2 mm diameter copper wire, height 10 mm, 2 mm and 4 mm inner and outer diameters) has been placed ~3 mm above of a 6 mm thick steel plate with a recess that mimics a structural defect. The rf coil is connected to the output of the balanced photodetector, which monitors the polarization of the probe beam in the atomic magnetometer located 200 mm above the plate. The measurement has been configured in the so-called self-compensation configuration [8]. In this configuration, the axis of the rf primary field is parallel to the offset magnetic field direction and orthogonal to the plate's surface. The amplitude of the atomic signal is recorded by the lock-in amplifier referenced to the signal frequency. The generation of the spin maser feedback action in the inductive experiment is more complex from that reported in the previous part. The signal created by the spontaneous precession of the atomic spin in the offset field is amplified and transferred to the primary rf field coil. This excites a response within the plate (secondary field) with an amplitude and direction defined by its surface structure.

Since the atomic magnetometer is sensitive only to rf field components orthogonal to the axis of the offset magnetic field, the atomic spin precession can only be driven by the secondary field components parallel to the plate surface. These components only become non-zero in the vicinity of the edges of the recess. Consequently, there is no spin maser action away from the defects, inhomogeneities or edges, i.e. over the homogeneous surface of the plate. The condition for positive feedback in the spin maser requires that the sum of all phase shifts in the feedback loop is zero [23], in other words, phase matching between the atomic spin precession and the drive produced by the secondary field. The phase of the drive is defined by the direction of the secondary field. As shown in [8], the change in the direction of the secondary field covers the full range of possible values (360°) as the primary field coil is scanned around the perimeter of the recess. This translates into a vortex in the detected signal phase, i.e. the phase of the drive seen by the atoms. The spin maser action will only be triggered above the region of the recess edge (i.e. for the direction of the secondary field), which ensures the phase matching condition within the atomic sample. The selection of this region can be controlled by introducing a phase shift between the detected signal and the rf coil. The change of the amplification in the feedback loop could be used to discriminate between defects of different size and depth as they have an influence on the secondary field strength. FIG. 7 shows images of a 64×64 mm² area of the plate containing a 24 mm diameter recess that is 2.4 mm deep recorded in the (a) standard and (b) spin maser self-compensation mode. The spin maser mode of operation ensures that the value recorded in the measurement represents the amplitude of the rf spectrum resonance and thus eliminates the need for monitoring of the whole spectral profile. This translates to a vast reduction of the image acquisition time. Typical recording time for the image in FIG. 7 (a), defined by acquisition of the rf spectrum at single location ~8 s, is 12 hours. In the same measurement conditions, it takes ~25 minutes to acquire the image in the spin maser mode, FIG. 7 (b-d). This time is limited to the movement time of the stepper motor. Because of the phase matching condition, only part of the recess signature shown in FIG. 7 (a) can be seen in (b). FIG. 7 (c) shows the image of the recess recorded with the same rf coil and a 180° phase shift with respect to the case shown in (b). This indicates that in order to recover the full signature of the recess, a set of coils, each with a relevant phase shift, can be implemented. Accordingly, a further embodiment of the invention includes a system as described above but with two coils with an opposite phase to record the image shown in FIG. 7 (d). While the whole signature of the recess (i.e. ring) is not recovered, the measurement proves that a multi-coil system can be used to ensure spin masing on the whole perimeter of the recess. Autonomous tuning of the spin maser system to the rf resonance enables to record the images such as shown in FIG. 7 (b-d) without degrading of the amplitude and contrast even without active field stabilisation. This dramatically simplifies an instrumentation of the imaging system since the fluxgate magnetometer and field stabilisation electronics such as PID units become obsolete.

As the change in the signal phase around the recess is monotonic, the phase dependence of the spin maser signal can be extracted from FIG. 7 (b) and (c). As shown in [8] the phase of the secondary field changes monotonically along the recess perimeter, which allows the calibration of the horizontal axis. FIG. 8 shows the change of the amplitude of the signal read along the perimeter of the recess signature in FIG. 7 (b).

The phase is arbitrarily set to 0° in the centre of the image and represents the case of perfect matching between the phase of the drive and atomic spin oscillations.

In conclusion, we have demonstrated alkali-metal spin maser operation in a magnetically shielded and in an open environment. The self-adjusting character of the measurement helps in the readout of the signal amplitude at the rf resonance frequency regardless of drifts in the offset magnetic field. This enables a vast improvement of the image capture rate. We have also presented a multi-rf coil system operation.

All details, in particular the operating conditions, parameters and dimensions, of the specific examples can be applied to any embodiments described herein.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in UK patent application number 1910213.6, from which this application claims priority, and in the abstract accompanying this application are incorporated herein by reference.

REFERENCES

1. C. Deans, L. Marmugi, S. Hussain, and F. Renzoni, Appl. Phys. Lett. 108, 103503 (2016).
2. A. Wickenbrock, N. Leefer, J. W. Blanchard, and D. Budker, Appl. Phys. Lett. 108, 183507 (2016).
3. C. Deans, L. Marmugi, and F. Renzoni, Opt. Exp. 25, 17911 (2017).
4. C. Deans, L. Marmugi, and F. Renzoni, Rev. Sci. Instrum. 89, 083111 (2018);
5. C. Deans, L. Marmugi, and F. Renzoni, Appl. Opt. 57, 2346 (2018).
6. P. Bevington, R. Gartman, W. Chalupczak, C. Deans, L. Marmugi, and F. Renzoni, App. Phys. Lett. 113, 063503 (2018).
7. P. Bevington, R. Gartman, and W. Chalupczak, Rev. Sci. Instrum. 90, 013103 (2019).
8. P. Bevington, R. Gartman, and W. Chalupczak, J. Appl. Phys. 125, 094503 (2019).
9. I. M. Savukov, S. J. Seltzer, and M. V. Romalis, J. Magn. Res. 185, 214 (2007).
10. P. Ripka, M. Janosek, IEEE Sensors J. 10, 1108 (2010).
11. T. Dogaru and S. T. Smith, Nondestr. Test. Eval. 16, 31 (2000).
12. T. Dogaru and S. T. Smith, IEEE Transactions on Magnetics 37, 5, 3831 (2001).
13. H. J. Krause and M. V. Kreutzbruck, Physica C 368, 70 (2002).
14. J. Storm, P. Hömmen, D. Drung, R. Körber, App. Phys. Lett. 110 072603 (2017).
15. J. Belfi, G. Bevilacqua, V. Biancalana, R. Cecchi, Y, Dancheva, and L. Moi, Rev. sci. Instrum 81, 065103 (2010).
16. G. Bevilacqua, V. Biancalana, P. Chesssa, Y. Dancheva, App. Phys. B 122, 103 (2016).
17. M. G. Richards, B. P. Cowan, M. F. Secca, and K. Machin, J. Phys. B: At. Mol. Opt. Phys. 21, 665 (1988).
18. T. E. Chupp, R. J. Hoare, R. L. Walsworth, and Bo Wu, Phys. Rev. Lett. 72, 2363 (1994).
19. R. E. Stoner, M. A. Rosenberry, J. T. Wright, T. E. Chupp, E. R. Oteiza, and R. L. Walsworth, Phys. Rev. Lett. 77, 3971 (1996).
20. D. Bear, T. E. Chupp, K. Cooper, S. DeDeo, M. Rosenberry, R. E. Stoner, and R. L. Walsworth, Phys. Rev. A 57, 5006 (1998).
21. T. G. Walker, and W. Happer, Rev. Mod. Phys. 69, 629 (1997).
22. H. G. Dehmelt, Phys. Rev. 105, 1924 (1957).
23. A. L. Bloom, Appl. Opt. 1, 61 (1962).
24. E. S. Ensberg, Phys. Rev. 153, 36 (1967).
25. Low-density noble gas spin maser with optical detection is described in A. Yoshimi, K. Asahi, K. Sakai, M. Tsudab, K. Yogob, H. Ogawab, T. Suzuki, and M. Nagakura, Phys. Lett. A 304, 13 (2002), and A. Yoshimi, T. Inoue, T. Furukawa, T. Nanao, K. Suzuki, M. Chikamori, M. Tsuchiya, H. Hayashi, M. Uchida, N. Hatakeyama, S. Kagami, Y. Ichikawa, H. Miyatake and K. Asahi, Phys. Lett. A 376, 1924 (2012).
26. M. J. Usher, W. F. Stuart, and S. H. Hall, J. Sci. Instr. 41, 544 (1964).
27. Pei-Xian Miao, Wen-Qiang Zheng, Shi-Yu Yang, Bin Wu, Bing Cheng, Jian-Hui Tu, Hong-Liang Ke, Wei Yang, Ji Wang, Jing-Zhong Cui, and Qiang Lin, J. Opt. Soc. Am. B 36, 819 (2019).
28. W. Chalupczak, R. M. Godun, P. Anielski, A. Wojciechowski, S. Pustelny, and W. Gawlik, Phys. Rev. A 85, 043402 (2012).
29. W. Chalupczak, R. M. Godun, S. Pustelny, and W. Gawlik, Appl. Phys. Lett. 100, 242401 (2012).
30. W. Chalupczak, P. Josephs-Franks, B. Patton, and S. Pustelny, Phys. Rev. A 90, 042509 (2014).
31. P. D. D. Schwindt, L. Hollberg, and J. Kitching, Rev. Sci. Instrum. 76, 126103 (2005).
32. J. M. Higbie, E. Corsini, and D. Budker, Rev. Sci. Instrum. 77, 113106 (2006).
33. J. Belfi, G. Bevilacqua, V. Biancalana, S. Cartaleva, Y. Dancheva, K. Khanbekyan, and L. Moi, J. Opt. Soc. Am. B 26, 910 (2009).
34. W. Chalupczak, and P. Josephs-Franks, Phys. Rev. Lett. 115, 033004 (2015).
35. Y. Takahashi, K. Honda, N. Tanaka, K. Toyoda, K. Ishikawa, and T. Yabuzaki, Phys. Rev. A 60, 4974 (1999).
36. M. Savukov, S. J. Seltzer, M. V. Romalis, and K. L. Sauer, Phys. Rev. Lett. 95, 063004 (2005).
37. D. Kleppner, H. M. Goldenberg, and N. F. Ramsey, Phys. Rev. 126, 603 (1962).

The invention claimed is:

1. An atomic magnetometer system, including:
   a variable magnetic field source configured to provide an oscillating primary magnetic field to cause a sample to produce a secondary magnetic field;
   an atomic magnetometer for detecting the secondary magnetic field; the atomic magnetometer including:
   an atomic specimen;
   a pump and probe subsystem configured to pump the atomic specimen to create a polarisation and to probe atomic coherence precession within the atomic specimen with a probe beam;
   a detector configured to detect the probe beam to produce a detection signal;
   the system being configured to drive the variable magnetic field source with a frequency in dependence on the detection signal and tuned to rf resonance; and
   wherein the system is configured to drive the variable magnetic field source with a frequency corresponding to the oscillation frequency of the detection signal.

2. A method of operating an atomic magnetometer to detect a secondary magnetic field produced by a sample, including:
   pumping an atomic specimen to create a polarisation and probing atomic coherence precession within the atomic specimen with a probe beam;
   detecting the probe beam to produce a detection signal;
   driving a variable magnetic field source with a frequency in dependence on the detection signal and with a frequency corresponding to the oscillation frequency of the detection signal, to provide an oscillating primary magnetic field to cause the sample to produce the secondary magnetic field with a frequency tuned to rf resonance.

3. The system of claim 1, wherein the variable magnetic field source is coupled to an output of the detector so as to be driven in dependence on the detection signal.

4. The system of claim 1, wherein the variable magnetic field source is configured to be placed adjacent to the sample.

5. The system of claim 1, including an instrument processor configured to receive the detection signal and to determine an amplitude and phase thereof.

6. The system of claim 1 including a voltage follower configured so as to drive the variable magnetic field source with a signal buffered from the detection signal.

7. The system of claim 1 including an amplifier configured so as to drive the variable magnetic field source with a signal amplified from the detection signal.

8. The system of claim 1 including a phase shifter configured so as to drive the variable magnetic field source with a signal phase shifted from the detection signal.

9. The system of claim 1, including a bias magnetic field source configured to provide to the atomic specimen a bias magnetic field in a bias field direction.

10. The system of claim 1, wherein the variable magnetic field source is an rf coil.

11. The system of claim 10, wherein the variable magnetic field source is driven in dependence on the detection signal with a frequency tuned to rf resonance by having a voltage signal dependent on the detection signal coupled across the rf coil.

12. The system of claim 1, wherein the atomic specimen includes a collection of alkali-metal atoms.

13. The system of claim 1, wherein the atomic specimen includes an alkali-metal atomic vapour.

14. The system of claim 1, including a set of variable magnetic field sources configured to provide the oscillating primary magnetic field, wherein the system is configured to drive each of the variable magnetic field sources in dependence on the detection signal with a frequency tuned to rf resonance and phase shifted with respect to each other.

15. The system of claim 14, including at least one phase shifter configured so as to drive at least one of the set of variable magnetic field sources with a signal phase shifted from the detection signal.

16. The system of claim 1, wherein the atomic magnetometer is configured so as to reduce the effect on the atomic magnetometer of components of the primary and secondary magnetic fields in a primary direction substantially orthogonal to a surface of the sample.

17. The system of claim 16, wherein the atomic magnetometer is in the self-compensation configuration.

18. The method of claim 2, wherein driving a variable magnetic field source in dependence on the detection signal includes driving the variable magnetic field source with a signal buffered, and/or amplified, and/or phase shifted, from the detection signal.

19. The method of claim 2, wherein driving a variable magnetic field source in dependence on the detection signal includes driving the variable magnetic field source with a frequency corresponding to a frequency of the detection signal.

20. The method of claim 2, including positioning the atomic specimen in a bias magnetic field.

21. The method of claim 2, including determining an amplitude and phase of the detection signal in order to detect the secondary magnetic field.

* * * * *